(12) United States Patent
Singer et al.

(10) Patent No.: US 11,846,679 B2
(45) Date of Patent: Dec. 19, 2023

(54) BATTERY CONTROL USING NON-LINEAR RATE-OF-CHANGE FAILURE THRESHOLD(S)

(71) Applicant: INTERNATIONAL BUSINESS MACHINES CORPORATION, Armonk, NY (US)

(72) Inventors: Noah Singer, White Plains, NY (US); John S. Werner, Fishkill, NY (US); Arkadiy O. Tsfasman, Wappingers Falls, NY (US); John Torok, Poughkeepsie, NY (US); Budy Notohardjono, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 361 days.

(21) Appl. No.: 17/307,069

(22) Filed: May 4, 2021

(65) Prior Publication Data

US 2022/0357403 A1 Nov. 10, 2022

(51) Int. Cl.
*G01R 31/3835* (2019.01)
*H02J 9/06* (2006.01)
*H01M 10/44* (2006.01)

(52) U.S. Cl.
CPC ........ *G01R 31/3835* (2019.01); *H01M 10/44* (2013.01); *H02J 9/061* (2013.01)

(58) Field of Classification Search
CPC ...... G01R 31/3835; H01M 10/44; H02J 9/061
(Continued)

(56) References Cited

U.S. PATENT DOCUMENTS

| 4,677,363 A | 6/1987 | Kopmann |
| 5,027,294 A | 6/1991 | Fakruddin et al. |

(Continued)

FOREIGN PATENT DOCUMENTS

| CN | 109856551 | * | 6/2019 |
| CN | 109856551 A | | 6/2019 |

(Continued)

OTHER PUBLICATIONS

Machine Translation of CN109856551, 8 pages (Year: 2019).*

(Continued)

*Primary Examiner* — Nathaniel R Pelton
(74) *Attorney, Agent, or Firm* — Tihon Poltavets, Esq.; Kevin P. Radigan, Esq.; HESLIN ROTHENBERG FARLEY & MESITI P.C.

(57) ABSTRACT

Rechargeable battery monitoring and control is provided using a non-linear rate-of-change failure threshold. A non-linear rate-of-change failure threshold is obtained indicative of an operational state abnormality in a rechargeable battery cell, and during the operational state of the rechargeable battery cell, a control compares an actual voltage rate-of-change of the rechargeable battery cell to the non-linear rate-of-change failure threshold. Based on the actual voltage rate-of-change of the rechargeable battery cell exceeding the non-linear rate-of-change failure threshold, the control identifies the operational state abnormality in the rechargeable battery cell. Based on identifying the operational state abnormality in the rechargeable battery cell, the control discontinues the operational state of the rechargeable battery cell.

20 Claims, 13 Drawing Sheets

(58) Field of Classification Search
USPC .......................................................... 320/132
See application file for complete search history.

(56) References Cited

U.S. PATENT DOCUMENTS

| | | | |
|---|---|---|---|
| 5,894,212 A | 4/1999 | Balogh | |
| 7,386,404 B2 | 6/2008 | Cargonja et al. | |
| 7,630,843 B2 | 12/2009 | Nguyen | |
| 9,581,651 B2* | 2/2017 | Rich | G01R 31/392 |
| 9,658,291 B1 | 5/2017 | Wang et al. | |
| 10,209,315 B2 | 2/2019 | Novak et al. | |
| 10,211,653 B2 | 2/2019 | Kadirvel et al. | |
| 10,594,145 B1 | 3/2020 | Wang et al. | |
| 11,322,949 B2* | 5/2022 | Chen | H02J 7/0014 |
| 2020/0088796 A1 | 3/2020 | Werner et al. | |
| 2020/0376983 A1* | 12/2020 | Titus | B60L 53/80 |
| 2021/0219383 A1* | 7/2021 | Trott | H04W 60/04 |
| 2023/0017285 A1* | 1/2023 | Shinoda | H02M 3/157 |

FOREIGN PATENT DOCUMENTS

| | | | |
|---|---|---|---|
| CN | 109856552 A | 6/2019 | |
| JP | H 11252819 A | 9/1999 | |
| JP | 2008-204750 A | 9/2008 | |
| WO | WO 2014/062162 A1 | 4/2014 | |

OTHER PUBLICATIONS

Erdinc et al., "A Dynamic Lithium-ion Battery Model Considering the Effects of Temperature and Capacity Fading", 2009 International Conference on Clean Electrical Power, ICCEP, pp. 383-386 (Year: 2009).

Mel et al., "The NIST Definition of Cloud Computing," National Institute of Standards and Technology, Information Technology Laboratory, Special Publication 800-145, Sep. 2011 (pp. 1-7).

Singer et al., "Selective Discharging of Rechargeable Battery Pack Across System Load", U.S. Appl. No. 17/205,110, filed Mar. 18, 2021 (51 pages).

PCT Application No. PCT/CN2022/083392, International Search Report & Written Opinion, dated Jun. 7, 2022 (9 pages) (Year: 2022).

* cited by examiner

BATTERY CONTROL USING NON-LINEAR RATE-OF-CHANGE FAILURE THRESHOLD(S)

BACKGROUND

A wide variety of batteries are available for use as an energy source, including as a backup energy source. A typical battery is formed by a number of electrical cells connected in a series or parallel configuration to define a battery pack. Many types of battery packs include rechargeable cells, such that when an energy source is applied to the cells, energy is stored within the cells. There are a variety of different chemical combinations for the cathode and anode of the cells, including, for instance, nickel cadmium (NiCd), nickel metal hydride (NiMH), and lithium-ion (Li-Ion) compositions.

For example, lithium-ion batteries are rechargeable batteries in which lithium-ions move from a negative electrode to a positive electrode during discharge, and back when charging. An intercalated lithium compound is used in a lithium-ion battery as one electrode material. The electrolyte (which allows for ionic movement) and the two electrodes are the constituent components of a lithium-ion battery cell. A cell is a basic electrochemical unit that contains the electrodes, separator and electrolyte. As noted, a battery or battery pack is a collection of cells or cell assemblies. These may be readied for use as a battery pack by providing, for instance, an appropriate housing and electrical interconnections, which depend on the implementation.

SUMMARY

Certain shortcomings of the prior art are overcome and additional advantages are provided through the provision, in one or more aspects, of a method which includes obtaining, by a control, a non-linear rate-of-change failure threshold indicative of an operational state abnormality in a rechargeable battery cell, and during the operational state of the rechargeable battery cell, comparing, by the control, an actual voltage rate-of-change of the rechargeable battery cell to the non-linear rate-of-change failure threshold. Based on the actual voltage rate-of-change of the rechargeable battery cell exceeding the non-linear rate-of-change failure threshold, identifying, by the control, the operational state abnormality in the rechargeable battery cell. Further, based on identifying the operational state abnormality in the rechargeable battery cell, the method includes discontinuing, by the control, the operational state of the rechargeable battery cell.

Systems and computer program products relating to one or more aspects are also described and claimed herein. Further, services relating to one or more aspects are also described and can be claimed herein.

Additional features and advantages are realized through the techniques described herein. Other embodiments and aspects of the invention are described in detail herein and are considered a part of the claimed aspects.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
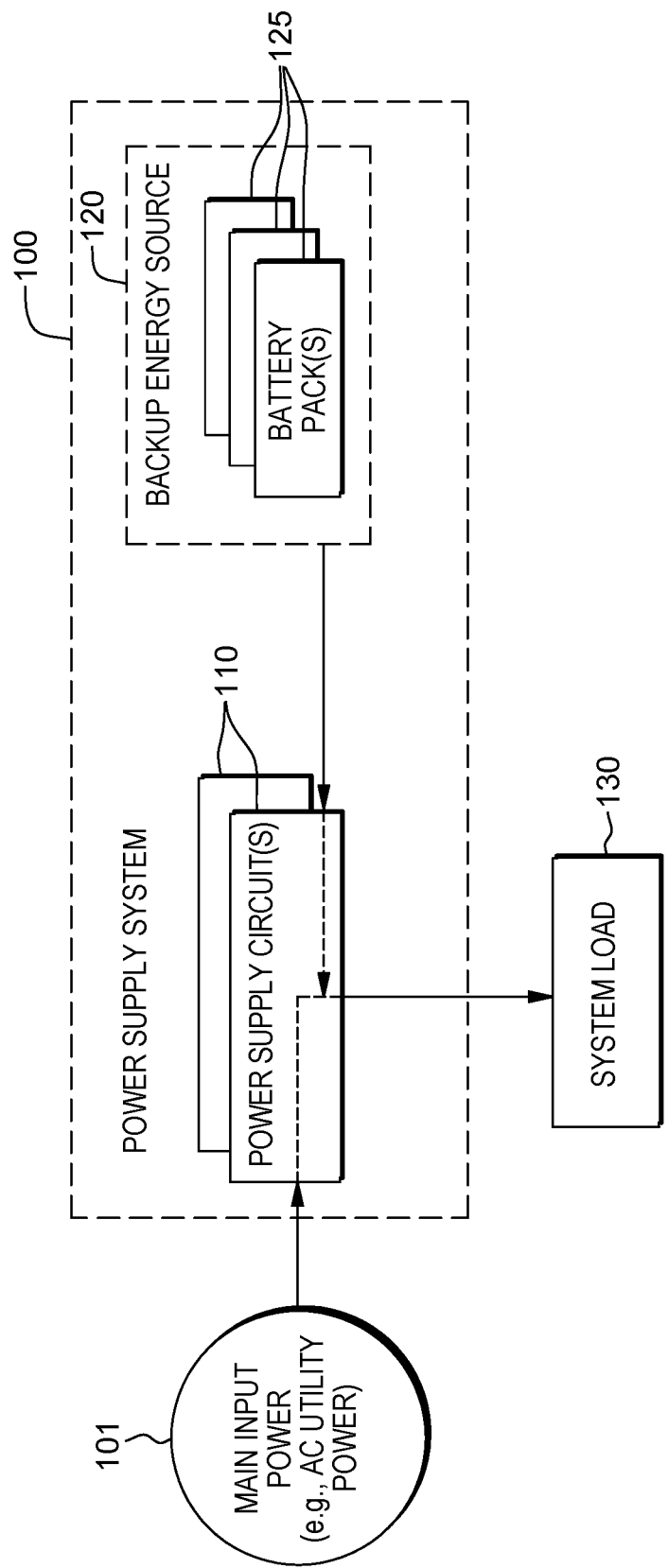
FIG. 1 depicts one embodiment of a power supply system in which rechargeable battery monitoring and control can be incorporated therein, in accordance with one or more aspects of the present invention.

The accompanying figures, in which like reference numerals refer to identical or functionally similar elements throughout the separate views, and which are incorporated in and form a part of the specification, further illustrate the present invention and, together with the detailed description, serve to explain aspects of the present invention. Note in this regard that descriptions of well-known systems, devices, processing techniques, etc., are omitted so as not to obscure the invention in detail. It should be understood, however, that the detailed description and this specific example(s), while indicating aspects of the invention, are given by way of illustration only, and not limitation. Various substitutions, modifications, additions, and/or other arrangements, within the spirit or scope of the underlying inventive concepts will be apparent to those skilled in the art from this disclosure.

Note further that numerous inventive aspects and features are disclosed herein, and unless inconsistent, each disclosed aspect or feature is combinable with any other disclosed aspect or feature as desired for a particular application of one or more of the concepts disclosed herein.

Note also that illustrative embodiments are described below using specific systems, circuits, designs, architectures, protocols, layouts, schematics, or tools only as examples, and not by way of limitation. Furthermore, the illustrative embodiments are described in certain instances using particular software, hardware, firmware, tools, or data processing environments only as example for clarity of description. The illustrative embodiments can be used in conjunction with other comparable or similarly purposed systems, applications, or architectures. One or more aspects of an illustrative embodiment can be implemented in hardware, software, or a combination thereof.

As understood by one skilled in the art, the controls (i.e., controllers or control systems) referenced in one or more embodiments described herein can include, for instance, a control interface and a microcontroller configured to perform at least one or more aspects of the processing described. In one or more implementations, the control processing is integrated within a power supply system, such as integrated within the power supply circuit and/or a backup energy source (such as a battery backup circuit(s)). In one or more other implementations, the control is implemented remotely from a power supply circuit and/or a backup energy source. For instance, in one or more embodiments, certain aspects of control processing described herein are implemented in a central location within an electronics rack or information technology (IT) rack containing the power supply system, or within a data center containing one or more electronics or IT racks with one or more power supply systems such as disclosed herein. In one or more further embodiments, certain monitoring and control processing aspects disclosed herein are implemented remotely, such as in a cloud-based environment, with the power supply system being operatively coupled to the monitoring and/or control across one or more networks.

Figure 9:
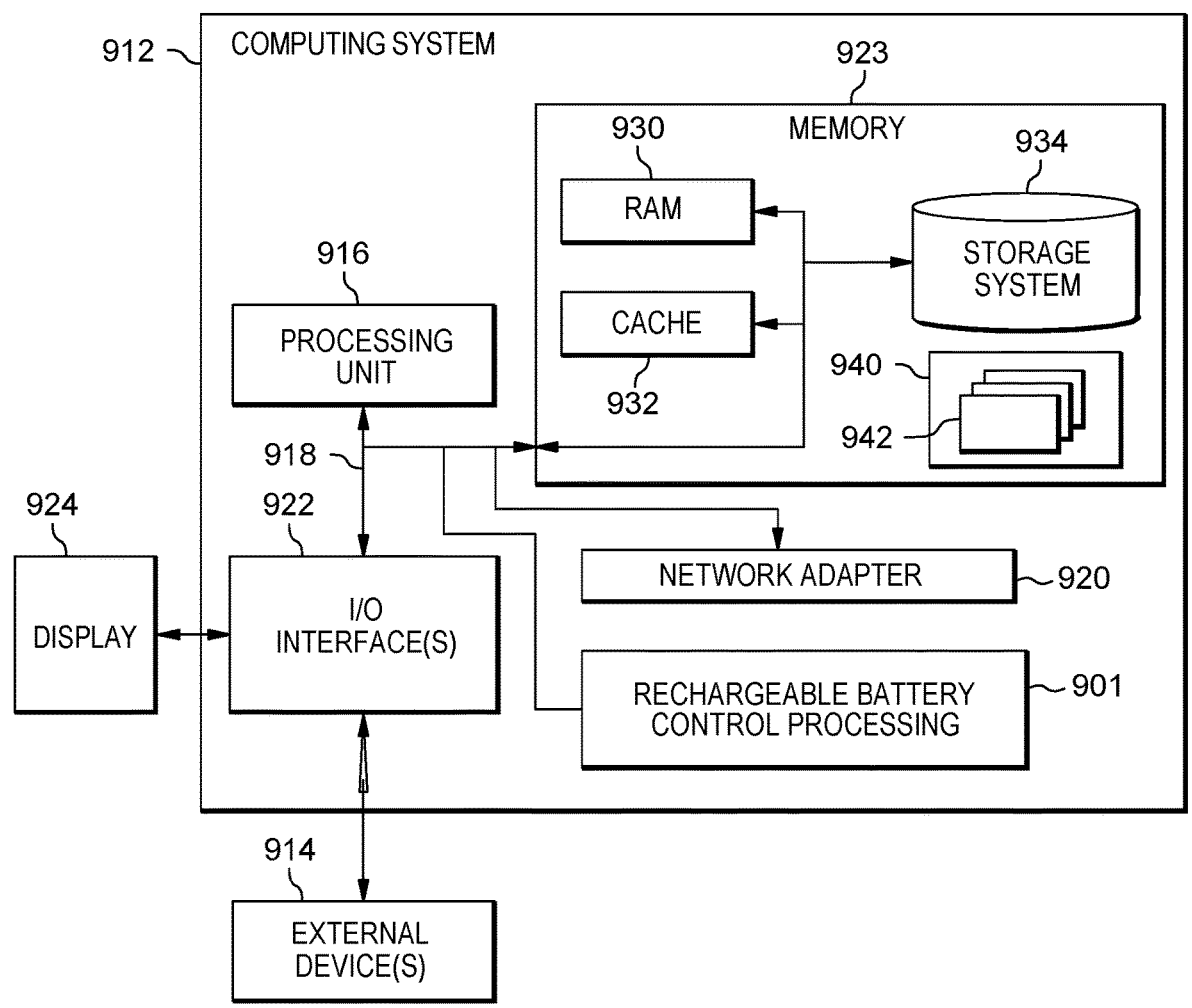
FIG. 9 depicts one embodiment of a computing system to implement, or facilitate implementing, one or more aspects of rechargeable battery monitoring and control processing, in accordance with one or more aspects of the present invention.

In certain embodiments, monitoring and control processing is implemented via program code. Program code, as referred to in this application, includes software and/or hardware. For example, program code in certain embodiments of the present invention can include fixed function hardware, but other embodiments can utilize a software-based implementation of the functionality described. Certain embodiments can combine both types of program code, for instance, as firmware. One example of program code, also referred to as one or more programs, is depicted in FIG. 9 as program/utility 940, having a set (at least one) of program modules 942, which can be stored in memory 923 and/or as a rechargeable battery monitoring/control module 901 of a computing system 912. In one or more other implementations, control processing can be implemented (at least in part) in one or more microcontrollers associated with, or provided as part of, a power supply system. For instance, in one implementation, a backup energy source of the power supply system can have a microcontroller associated therewith to facilitate performing one or more aspects of the battery monitoring and/or control processing disclosed herein.

In one example only, computing (or information technology (IT)) racks can include a variety of electronic components, as well as a power supply system to provide desired power levels to the electronic components within the computing rack. In one implementation, the power supply system can be an uninterruptible power supply (UPS), and can include one or more power supply circuits and one or more backup energy sources. The power supply circuit(s) receives main input power, such as AC utility power, and the backup energy source(s) is operatively coupled to the power supply circuit(s) to supply backup power to a system load when main input power to the power supply system is unavailable. In one particular implementation, the power supply circuit is a power regulation circuit, or power regulator, which is configured to supply one or more desired DC voltage levels to components within a system load, such as one or more electronic components within a computing rack or server system.

In one implementation, the backup energy source(s) includes one or more rechargeable battery packs. As noted, there are a wide variety of batteries available for use as energy sources, including as backup energy sources. Lithium-ion batteries currently have certain advantages over other rechargeable battery technologies, including, for instance, a higher power density, a lower weight, a lower self-discharge, and little or no "memory" effect. Lithium-ion batteries can be used in many energy applications, including as a backup energy supply for computing systems, such as computing racks, server systems, workstations, desktop computers, etc.

In certain embodiments, a backup energy source includes one or more rechargeable battery packs which provide standby power to a power supply circuit for powering a system load for at least a specified period of time upon loss of main input power. Depending on the implementation, a computing system can require a number of rechargeable battery packs as part of the backup energy source, with each pack including a potentially large number of battery cells. As noted, a backup energy source can include one or more circuits or components associated with the rechargeable battery packs to facilitate, when appropriate, charging or discharging of the battery packs to provide, for instance, backup power to the system load.

By way of example only, FIG. 1 depicts one embodiment of a power supply system 100 to supply power to a power supply system load 130, such as one or more components of a computing system. In the embodiment illustrated, power supply system 100 includes one or more power supply circuits 110 which receive main input power 101 to facilitate powering system load 130. In one embodiment, main input power 101 can be, for instance, AC utility power received at power supply system 100.

As illustrated, power supply system 100 also includes an integrated backup energy source 120 with one or more battery packs 125 operatively coupled to power supply circuit(s) 110 to supply backup power to system load 130 when main input power 101 to power supply circuit 110 is interrupted. By way of specific example, system load 130 can be one or more components within a computing system, such as a computing rack requiring DC voltage, and power supply circuit(s) 110 can be, or include, one or more power regulators which, by way of example only, receive AC utility power, and rectify and regulate the power to provide a desired DC voltage to system load 130. Note that this is one example only of a power supply with rechargeable battery cells.

Figure 2:
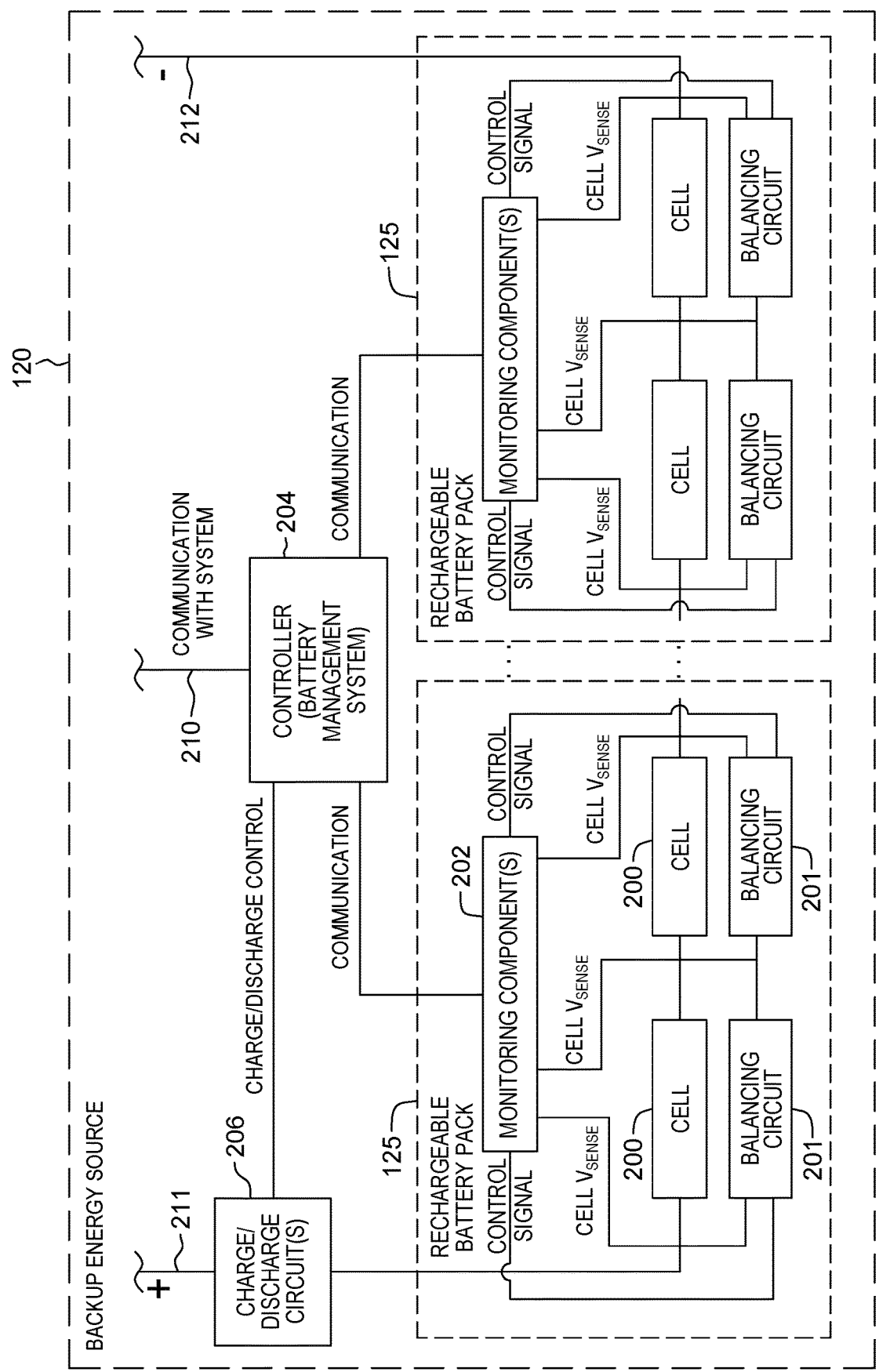
FIG. 2 depicts one embodiment of a backup energy source, with one or more rechargeable battery packs, for use within a power supply system such as depicted in FIG. 1, in accordance with one or more aspects of the present invention.

FIG. 2 depicts one embodiment of backup energy source 120 which can be used, for instance, in a power supply system such as depicted in FIG. 1. As illustrated, backup energy source 120 can include multiple rechargeable battery packs 125.

In the embodiment of FIG. 2, rechargeable battery packs 125 include a plurality of battery cells 200, grouped into one or more cell stacks. In one or more embodiments, cell voltage is monitored or sensed by monitoring components 202. The sensed cell voltages allow monitoring components 202, and thereby a controller 204, to know the state of charge (SoC) a cell is in, for instance, for shutting off or adjusting charging or discharging of the cell. Monitoring components 202 are provided to monitor voltage across the individual cells 200 in the battery packs, and balancing circuits 201, such as one or more respective transistors and resistors, allow each cell to balance with the other cells in the battery pack for network balancing purposes. In one embodiment, the battery cells are lithium-ion battery cells, the monitoring components 202 are multi-cell, lithium-ion battery managers, such as the multi-cell, lithium-ion battery managers available from various industry suppliers. Monitoring components 202 are operatively coupled to a controller (or battery management system) 204, which in one embodiment implements, at least in part, processing in accordance with one or more aspects disclosed herein. As shown, controller 202 is coupled to a charge/discharge circuit 206 for battery charge and discharge control, in accordance with one or more aspects of the present invention. Additionally, controller 204 can be in communication with one or more power supply system components, such as a controller associated with the power supply circuit(s) of the power supply system, such as described below in connection with the example embodiment of FIG. 3.

Power input 211 and power output 212 lines are also provided, coupling backup energy source 120 to the power supply circuit(s), such as to a bus of the power supply circuit providing power to system load, such as system load 130 in the embodiment of FIG. 1.

Figure 3:
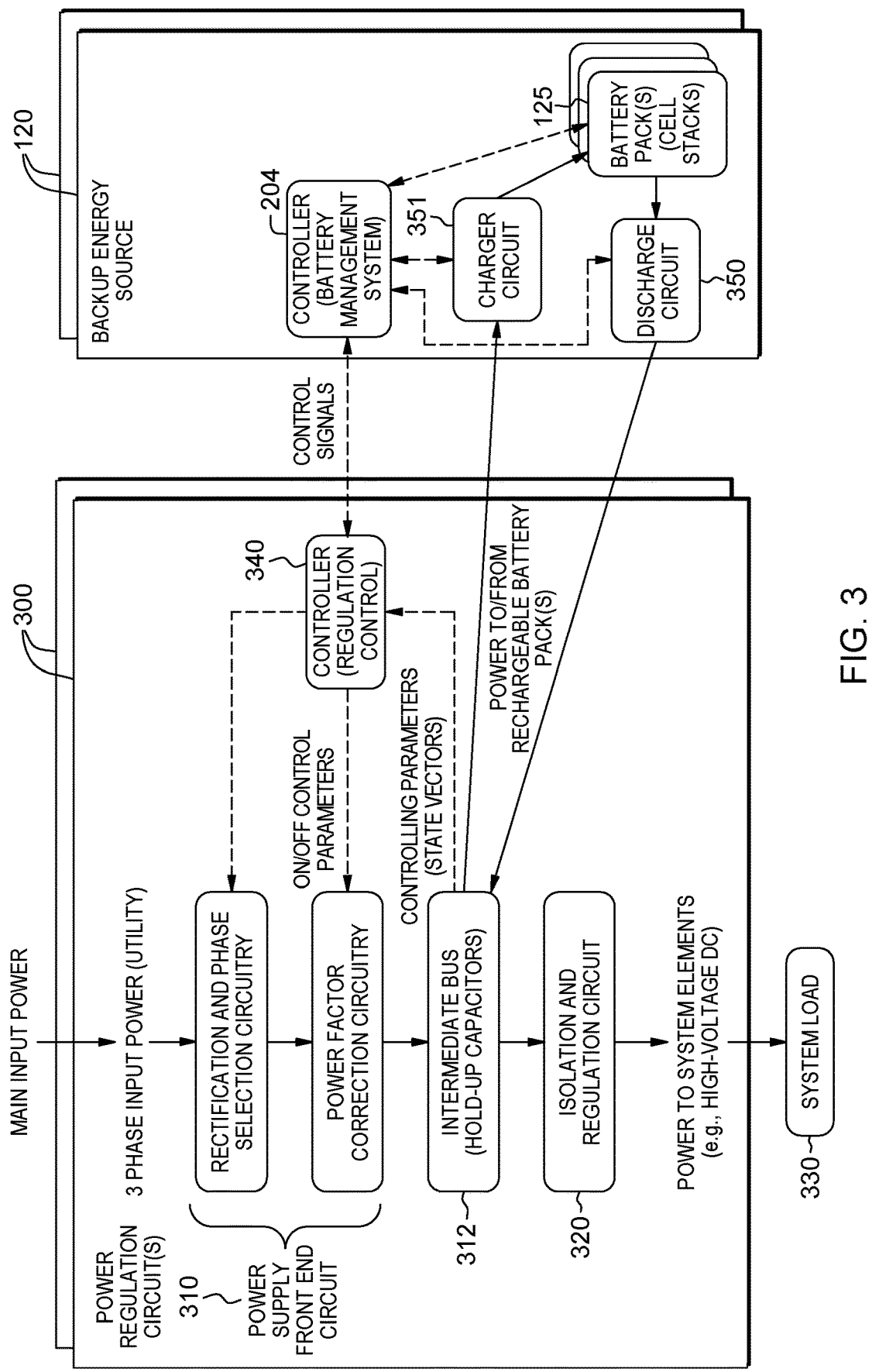
FIG. 3 depicts a further embodiment of a power supply system in which rechargeable battery monitoring and control can be incorporated therein, in accordance with one or more aspects of the present invention.

FIG. 3 depicts a further embodiment of a power supply system which includes redundant power supply circuits, implemented as power regulation circuits 300, and redundant backup energy sources 120, with each backup energy source including multiple rechargeable battery packs 125. In one embodiment, each power regulation circuit 300 has an associated backup energy source 120 for supplying backup power to a system load when main input power to the power supply circuit is unavailable.

As illustrated, in one embodiment, each power regulation circuit 300 is connected to receive main power input, such as to an AC utility power line to receive, for instance, three-phase input power. In the illustrated embodiment, power regulation circuit 300 includes a power supply front end circuit 310, including, for instance, rectification and phase selection circuitry, as well as power factor correction circuitry. Further, in the embodiment illustrated, power supply front end circuit 310 provides power to an intermediate bus 312 with hold-up capacitors (in one embodiment). Intermediate bus 312 powers an isolation and regulation circuit 320 (or power supply back end circuit) which provides power to system elements of system load 330, for instance, as a high-voltage DC, depending on the system load requirements.

In the embodiment illustrated, a controller 340 (e.g., regulation control) is part of, or associated with, power regulation circuit 300. In part, controller 340 obtains controlling parameters and state vectors from intermediate bus 312 and provides, in one embodiment, ON/OFF control parameters to power supply front end circuit 310, including rectification and phase selection circuitry and power correction circuitry in the embodiment illustrated.

As illustrated in FIG. 3, power to/from the backup energy source(s) is provided by/to intermediate bus 312 of power regulation circuit 300. In the embodiment illustrated, backup energy source 120 includes one or more rechargeable battery packs 125, each with one or more respective cell stacks, as well as a battery pack controller 204, a discharge circuit 350 and a charge circuit 351. In operation, controller 340 of power regulation circuit 300 and controller 204 of the backup energy source 120 are in operative communication via exchange of appropriate control signals.

In normal operation, power flows from main input power, through power regulation circuit 300, to system load 330 via intermediate bus 312. When main input power is unavailable, such as interrupted, power is provided via one or more rechargeable battery packs 125 of backup energy source 120 to intermediate bus 312 to replace the charge lost. In typical operation, this replacement is automatic and results in self-discharging of the rechargeable battery pack(s). For instance, in one embodiment, with main input power provided, the intermediate bus voltage is at a first level, and upon the main input power becoming unavailable, intermediate bus 312 voltage begins to drop to a voltage level where the battery energy source 120 automatically begins providing power from the rechargeable battery pack(s) 125 to intermediate bus 312.

In one embodiment, power regulation circuit 300 of the power supply system embodiment of FIG. 3 is an example of a bulk power regulator (BPR) for a computing rack, where one or more DC voltage levels are provided to system elements within the rack. This is one example only of a power supply system which can include rechargeable battery cell monitoring and control such as disclosed herein.

Figure 4A:
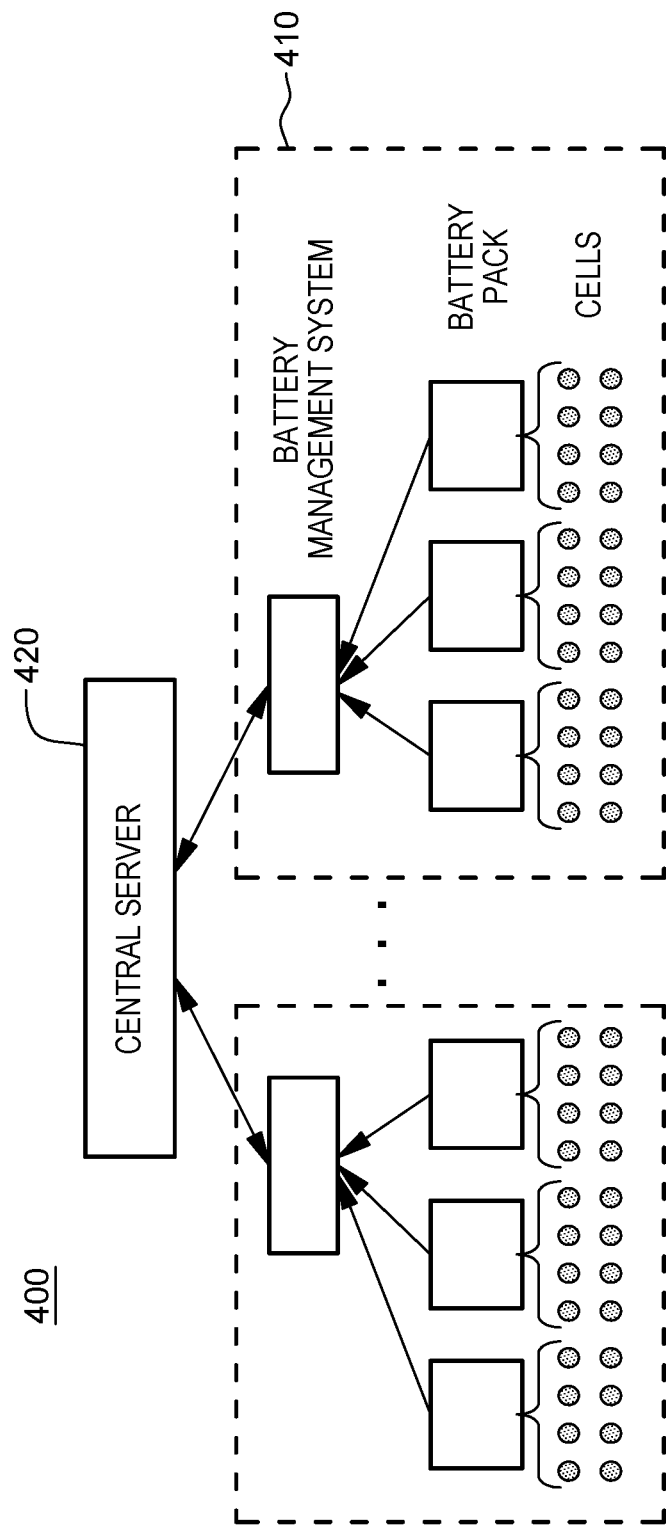
FIG. 4A depicts one embodiment of a rechargeable battery monitoring and control system, in accordance with one or more aspects of the present invention.

FIG. 4A is a high-level depiction of a further embodiment of an environment 400 incorporating a rechargeable battery monitoring and control system, in accordance with one or more aspects of the present invention. In the depicted environment 400, a plurality of similar end user products 410 are assumed, along with one or more central cognitive servers 420. Products 410 can be any of a variety of products available today which use or incorporate rechargeable batteries, either as a primary energy source, or as a backup energy source. For instance, products 410 can be computing racks at one or more data center installations in one or more geographic locations. As noted above, the products can also be other types of systems or devices, such as automobiles, mobile devices, watches, cameras, etc., and can generally be any product which currently, or in the future, can benefit from the use of rechargeable batteries. In the embodiment depicted, the one or more central cognitive servers 420 communicate with system level controllers, such as a battery management system noted above, associated with each product.

The battery management system (or integrated battery feature) within product 410 provides pack-level or cell-level control and monitoring, which can include use of monitoring component(s), such as the monitoring component(s) noted above. Each product is shown to include a plurality of rechargeable battery cells, which in one or more embodiments, can be individual lithium-ion cells. In implementation, products 410 can be owned by a same end user or can be the same product owned by different end users. A variety of battery-related actions can be performed as described herein based on the rechargeable battery management system monitoring. For instance, cell performance data from multiple products 410 can be received at a backend cognitive server 420 that has access to the battery information for a plurality of battery cells currently in operation. In one or more implementations, the battery-related action taken by the system can be, for instance, discontinuing use of a particular battery cell and/or generating a notification to an end user to replace one or more integrated battery features, battery packs, and/or individual rechargeable battery cells within a particular product. Further, central cognitive server 420 can direct one or more individual battery management systems to take action to improve battery cell safety by, for instance, discontinuing charge or discharge of one or more individual rechargeable battery cells within a product.

Figure 4B:
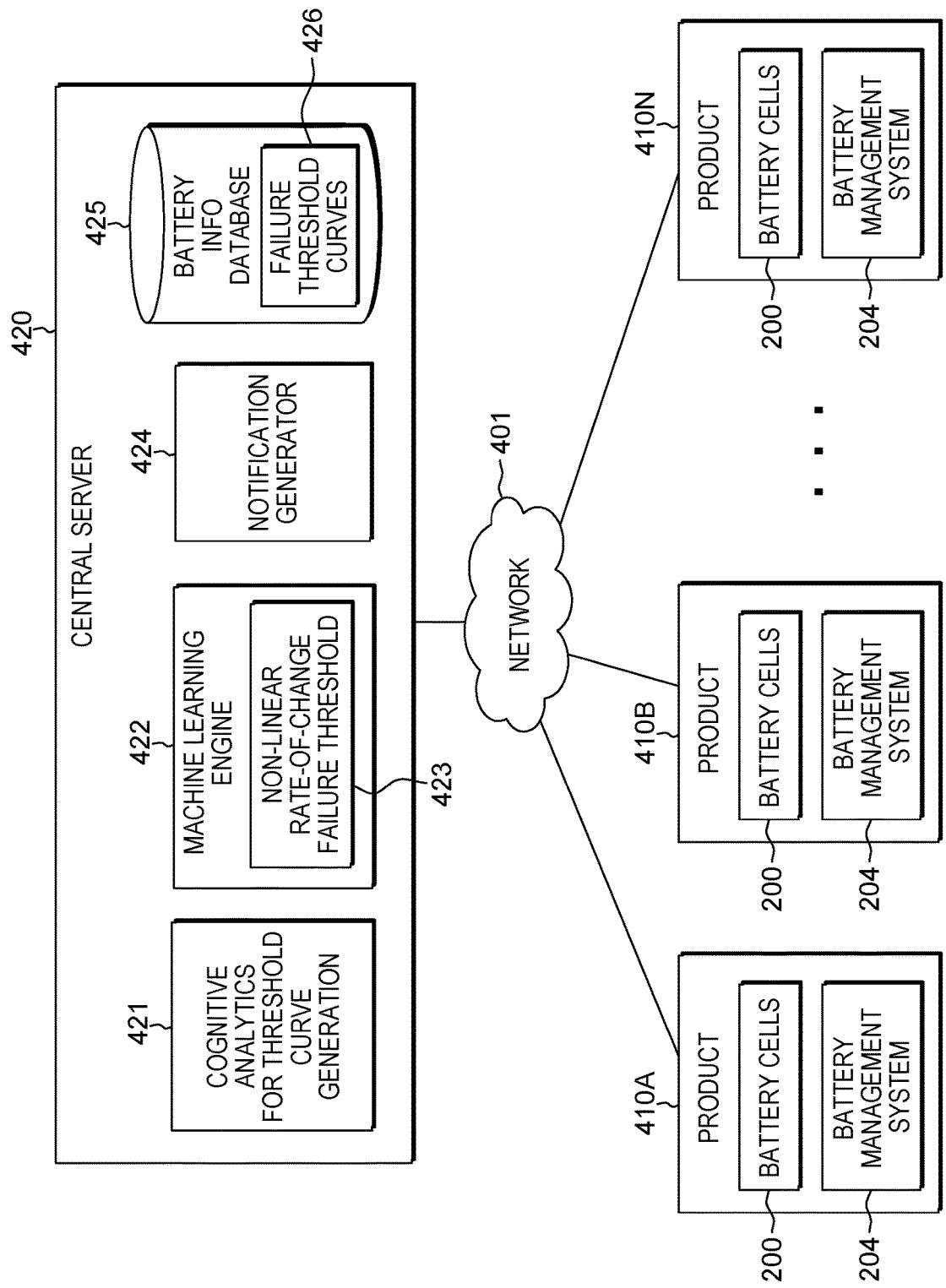
FIG. 4B is a further depiction of one embodiment of a rechargeable battery monitoring and control system, in accordance with one or more aspects of the present invention.

FIG. 4B depicts a more detailed embodiment of environment 400 of FIG. 4A, wherein central cognitive server 420 is in communication with multiple products 410A, 410B . . . 410N across a network 401. Network 401 can be, for example, a telecommunications network, a local area network (LAN), a wide area network (WAN), such as the Internet, or a combination thereof, and can include wired, wireless, fiber optic connections, etc. Network 401 can include one or more wired and/or wireless networks that are capable of receiving and transmitting data, and control signals, as described herein. As noted, each product 410A, 410B . . . 410N includes one or more rechargeable battery cells and, in one or more embodiments, a battery management system, such as the rechargeable battery cells 200 and battery management system 204 described above in connection with the embodiments of FIG. 2. As noted, the products are (in one embodiment) operational products in use at or for one or more end user(s).

By way of example, in one or more embodiments, central cognitive server 420 implements a variety of engines, and can be, or can utilize, for instance, a cloud-based system. One cognitive system is the IBM Watson® system available from International Business Machines Corporation of Armonk, New York, USA. The IBM Watson system is an application of advanced natural language processing, information retrieval, knowledge representation and reasoning, and machine-learning technologies in the field of domain question answering. The IBM Watson system is built on International Business Machines Corporation's DeepQA™ technology used for hypothesis generation, massive evidence gathering, analysis, and scoring.

In the embodiment depicted, central cognitive server 420 includes, by way of example, a cognitive analytics for threshold curve generation 421, which aggregates data from products 410A-410N and facilitates generating (for instance) one or more discharge curves dependent, for example, on the age and/or usage of the battery cells (e.g., number of charge cycles) of the same type, as well as specifies, for instance, the curve limits, or threshold deviation curves. A machine learning engine 422 can be included to learn and establish baseline behavioral profiles for battery cells, and be used to find meaningful anomalies, which can be used as a basis for performing one or more battery-related actions. The machine learning engine 422 can include a non-linear rate-of-change failure threshold facility 423, or engine, that compares a battery cell's data to one or more generated failure threshold curves obtained from battery cell testing and/or statistical data on battery cell performance of a plurality of battery cells of similar type to the battery cell. For instance, the statistical data can be accumulated at different points in the life cycle of the battery cells. A notification generator or facility 424 is also included to, for instance, provide an alert or notification to a user, operator, technician, etc., to replace a battery cell or battery pack that is failing a non-linear rate-of-change failure threshold prior to the battery cell experiencing a failure event, such as thermal runaway and/or ignition event. Central cognitive server 420 can also include a database 425 to hold, for instance, received data from the products for generating and saving failure threshold curves 426, such as described herein.

Rechargeable battery cells, including high-energy density battery cells, such as Lithium-ion cells, have the potential to fail if subjected to mechanical, electrical, or thermal abuse. As disclosed herein, a control (such as a battery management system (BMS)) is provided to monitor and control the cells in a battery pack, to provide protection against a runaway event due to, for instance, abuse of the cell. In one or more embodiments, a system is disclosed which implements a monitoring approach during an operational state of a cell (such as during a discharge cycle and/or charge cycle of the cell) to detect cells with abnormalities during discharge/ charge. If a cell is acting abnormally, then the operational state is discontinued by the control to prevent further damage to the cell, which could otherwise lead to a thermal runaway condition. In one embodiment, where the operational state is a discharge state of the rechargeable battery cell, the system monitoring process looks for high rate-of-change voltage occurrences during discharge. In other words, in one embodiment, the battery management system monitors for sharp changes in a discharge curve of a cell, since the curve for a healthy cell has smooth transitions. By way of example, FIG. 5A graphically depicts one embodiment of battery cell discharge monitoring, where the battery cell has a normal discharge cycle ($\Delta V$ of discharge).

Figure 5A:
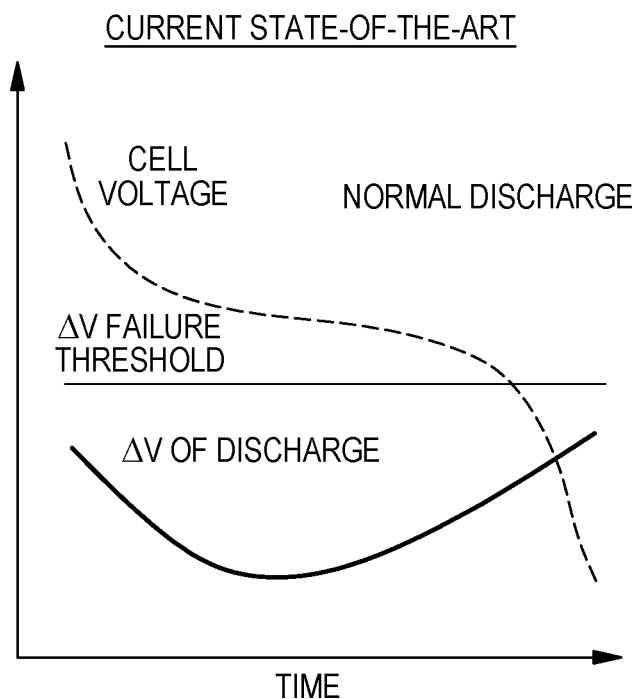
FIG. 5A graphically depicts one example of battery cell discharge monitoring using a static failure threshold.
Figure 5B:
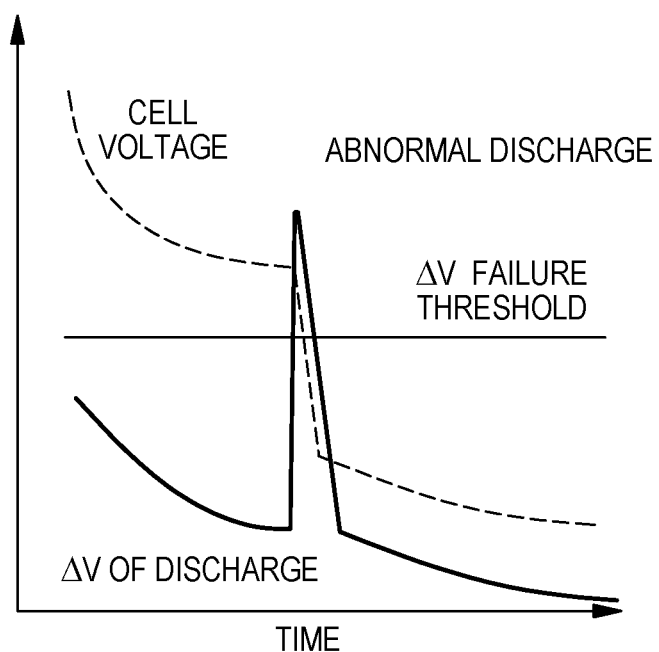
FIG. 5B graphically depicts occurrence of a discharge abnormality being detected using the static failure threshold of FIG. 5A.

As illustrated in FIG. 5A, battery cell voltage during normal discharge typically proceeds quickly at first, levels off, and then proceeds more quickly closer to the end of discharge. This results in a non-linear rate-of-change voltage discharge ($\Delta V$ of discharge) over the discharge cycle, as illustrated. Typically, a rate-of-change failure threshold ($\Delta V$ failure threshold) is provided as a static threshold value of a voltage rate-of-change indicative of a failing cell. If the actual voltage rate-of-change ($\Delta V$ of discharge) during discharge exceeds this threshold value (as illustrated in FIG. 5B), then the management system identifies an operational state abnormality in the rechargeable battery cell.

An issue with using a single, static threshold value for voltage rate-of-change abnormality detection is that the typical battery discharge curve is non-linear, so that at different times during the discharge cycle, different rates- of-change can be expected to be normal. Therefore, using a static threshold value provides only a rough monitoring of the discharge curve, which can be more or less accurate, depending on where along the discharge curve the cell is currently operating. This can be seen in FIG. 5A, where the actual voltage rate-of-change is closer to the rate-of-change failure threshold at the beginning and end of the discharge cycle, and further away during the middle of the discharge cycle. The result of this difference is that the amount of time required to identify a failing cell during a discharge cycle can vary, depending upon where in the discharge cycle the cell is at the time of failure. This can be seen in FIG. 5B, where the actual voltage rate-of-change during discharge exceeds the threshold value at a time when the actual voltage rate-of-change is furthest from the static threshold value ($\Delta V$ failure threshold), meaning that it takes more time for the system to identify the failing cell, which can potentially lead to further cell damage.

An additional issue with using a single static threshold value for voltage rate-of-change abnormality detection is that the battery's operational state curve, such as the battery's discharge curve, will change over time due to cell aging and other factors, such as operating temperature and previous depth of discharging and/or charging. Therefore, using a single static failure threshold value over the life of a battery cell provides only a rough approximation for monitoring of a cell's actual operational state curve, depending on where the cell is currently operating in the life of the cell, and under what conditions.

Figure 6:
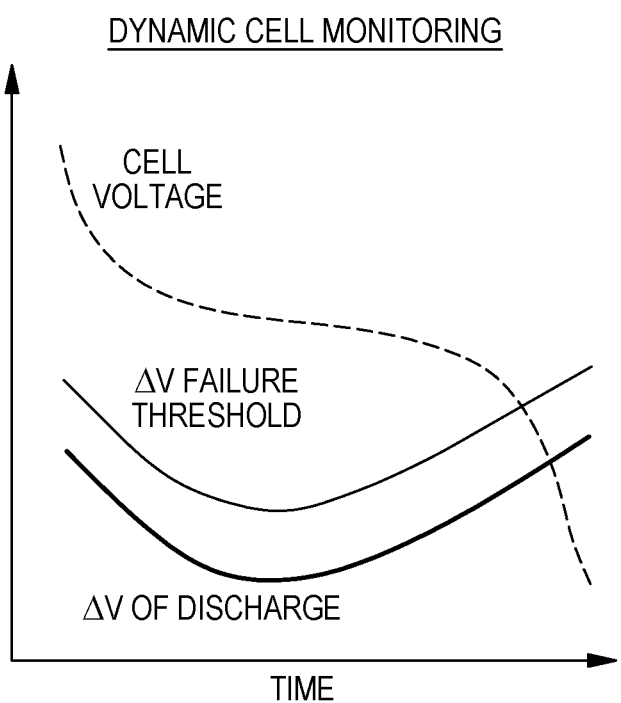
FIG. 6 graphically illustrates one embodiment of dynamic battery cell monitoring using a non-linear rate-of-change failure threshold, in accordance with one or more aspects of the present invention.

Addressing these issues, presented herein in one or more embodiments is a non-linear rate-of-change threshold (i.e., changing voltage rate-of-change abnormality detection threshold) for a control to use to determine when a cell is failing when operating. The rate-of-change threshold is non-linear in that the threshold dynamically changes based on where along the discharge curve the cell is currently operating. In areas where the discharge curve is steeper (beginning and end of the discharge cycle), the voltage rate-of-change threshold is raised by the system, and in areas where the discharge curve is shallower (i.e., the middle of the discharge cycle), the voltage rate-of-change threshold is lowered by the system. The result is that the rate-of-change voltage threshold varies in time, for instance, in a concave manner during discharge of the rechargeable battery cycle. An example of this is depicted in FIG. 6, where the rate-of-change voltage failure threshold curve ($\Delta V$ failure threshold) is shown to substantially parallel the actual rate-of-change voltage discharge curve ($\Delta V$ of discharge) of the battery cell. In one or more embodiments, the rate-of-change voltage failure threshold can be predetermined as a certain percentage (or within a range of percentages) above the anticipated rate-of-change voltage values, which as illustrated in FIG. 6, dynamically changes during the discharge cycle. Note that although described herein principally in connection with a discharge state of a rechargeable battery cell, the concepts disclosed are also applicable to the charge state of a rechargeable battery cell. The discharge state and the charge state are each examples of operational states of a battery cell.

Embodiments of the present invention include a method, system and computer program product, where program code executing, for instance, as part of a control (e.g., controller or control system) obtains a non-linear rate-of-change failure threshold indicative of an operational state abnormality in a rechargeable battery cell. During the operational state of the rechargeable battery cell, the control compares the actual voltage rate-of-change of the rechargeable battery cell to the non-linear rate-of-change failure threshold. Based on the actual voltage rate-of-change of the battery cell exceeding the non-linear rate-of-change failure threshold, the control identifies the operational state abnormality in the rechargeable battery cell. Based on identifying the operational state abnormality in the rechargeable battery cell, the control discontinues the operational state of the rechargeable battery cell. Advantageously, the non-linear rate-of-change failure threshold obtained (e.g., determined, retrieved, preset, learned, etc.) more closely mirrors the actual voltage rate-of-change of the rechargeable battery cell during the operational state, and as such, allows for the control to more consistently and quickly determine when a discharge abnormality occurs in the rechargeable battery cell, and thus, to more quickly take action with respect to that abnormality, such as discontinue the operational state of the rechargeable battery cell, whether discharging or charging. By reacting more quickly, the system is better able to prevent a thermal runaway event from occurring.

In one or more embodiments, the non-linear rate-of-change failure threshold includes a failure threshold curve which is substantially parallel to an expected voltage rate-of-change curve for the rechargeable battery cell during the operational state. In one embodiment, the operational state is a discharge state of the rechargeable battery cell, and the non-linear rate-of-change failure threshold includes a voltage rate-of-change threshold which varies in time in a concave manner during a discharge cycle of the rechargeable battery cell.

In one or more embodiments, the non-linear rate-of-change failure threshold is predetermined, and is obtained, by the control, from a database of predetermined non-linear failure threshold curves using a prior operational state cycle time of rechargeable battery cells. Further in one embodiment, the particular non-linear rate-of-change failure threshold obtained from the database varies for different operational state cycle times of the rechargeable battery cell.

In one or more implementations, obtaining the non-linear rate-of-change failure threshold includes obtaining, via machine learning, the non-linear rate-of-change failure threshold based on one or more voltage rate-of-changes experienced during one or more prior operational state cycles of the rechargeable battery cell.

In one embodiment, the obtained non-linear rate-of-change failure threshold varies across operational state cycles of the rechargeable battery cell, and the obtained non-linear rate-of-change failure threshold is based, at least in part, on an operational state cycle count for the rechargeable battery cell.

In one implementation, the operational state is a discharge state of the rechargeable battery cell, and the obtaining includes obtaining an expected discharge cycle time for discharge of the rechargeable battery cell based on a discharge cycle count for the rechargeable battery cell, and compressing a prior failure threshold curve to fit the expected discharge cycle time and obtain a compressed failure threshold curve. The obtained non-linear rate-of-change failure threshold is the compressed failure threshold curve, in one embodiment. For instance, in one embodiment, the prior failure threshold curve is an initial failure threshold curve obtained for the rechargeable battery cell, which is then compressed over time, based on the discharge cycle count.

In one or more embodiments, the operational state is a discharge state of the rechargeable battery cell, and the obtained non-linear rate-of-change failure threshold includes a voltage rate-of-change threshold which varies in time in a concave manner during a discharge cycle of the rechargeable battery cell, and the compressing makes the prior failure threshold curve shallower for the voltage rate-of-change and shorter in discharge cycle time to obtain the compressed value threshold curve.

In one embodiment, the method further includes providing, by the control, an indication of the operational state abnormality based on identifying the operational state abnormality in the rechargeable battery cell.

Figure 7:
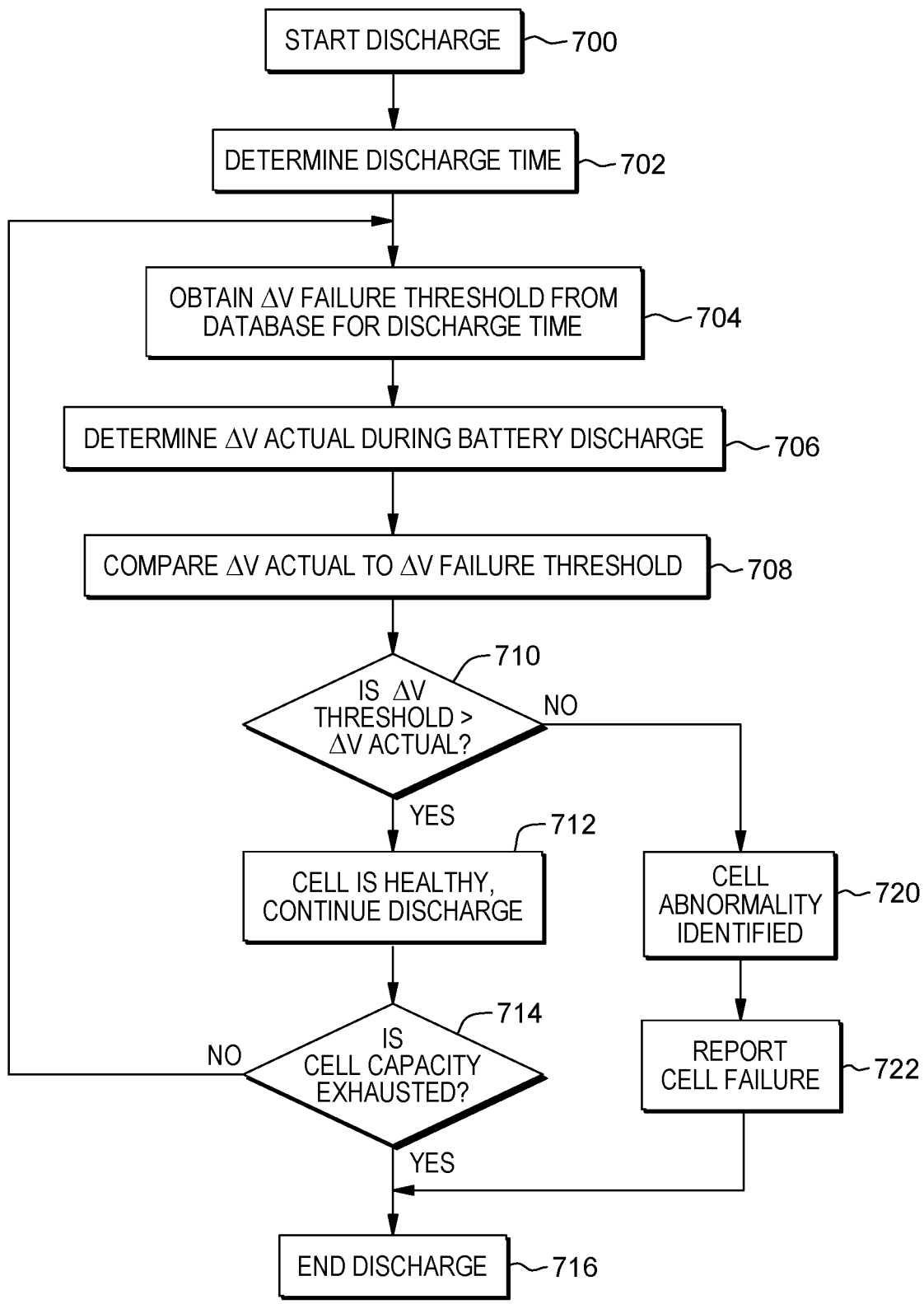
FIG. 7 depicts one embodiment of a workflow illustrating certain aspects of some embodiments of the present invention.

FIG. 7 depicts one embodiment of a workflow illustrating certain aspects of some embodiments of the present invention. In this workflow, it is assumed that the operational state at issue is a discharge state of a rechargeable battery cell, by way of example only. A similar process to that depicted in FIG. 7 and described below applies to a charge state of the rechargeable battery cell as well.

Referring to FIG. 7, a discharge state of a rechargeable battery cell is started 700, and control determines a prior discharge cycle time 702. In one embodiment, a plurality of non-linear rate-of-change failure thresholds, also referred to herein as failure threshold curves, are predetermined and saved to a database accessible by the control. In one or more embodiments, the non-linear rate-of-change failure thresholds are pre-generated based on laboratory testing. For instance, in one or more embodiments, the non-linear rate-of-change failure thresholds are predetermined during a test stage of the rechargeable battery cell, or a test stage of other rechargeable battery cells of the same type, size and construction. This is one example only. In another embodiment, a cognitive control, such as described above in connection with FIGS. 4A & 4B, is provided to evaluate actual rechargeable battery cell data and dynamically provide an appropriate non-linear rate-of-change failure threshold for the particular rechargeable battery cell, for instance, based on battery cell type and lifecycle of the battery cell, as well as other factors.

In one embodiment, the prior discharge cycle time 702 (e.g., the just-prior discharge cycle time) is used as an index into the database to obtain the most applicable non-linear rate-of-change failure threshold for the rechargeable battery cell. The non-linear rate-of-change failure threshold ($\Delta V$ failure threshold) is obtained from the database for the discharge time 704, and during discharge, the control determines an actual voltage rate-of-change ($\Delta V$ actual) of the rechargeable battery cell 706. The control compares the actual voltage rate-of-change to the non-linear rate-of-change failure threshold 708, and determines whether the non-linear rate-of-change failure threshold is greater than the actual voltage rate-of-change 710. If "yes", then the battery cell is healthy, and discharge continues 712. If cell capacity is exhausted 714, that is, the battery cell is discharged to the desired level, then the discharge cycle ends 716, otherwise, the process repeats using the obtained non-linear rate-of-change failure threshold.

If the actual voltage rate-of-change of the rechargeable battery cell exceeds the non-linear rate-of-change failure threshold, then a cell abnormality is identified 720, based on which the control provides an indication of the discharge abnormality 722, and discontinues discharge of the rechargeable battery cell 716.

As noted, in one or more embodiments, the non-linear rate-of-change failure threshold value changes dynamically during the operational state. In the discharge cycle example described, the non-linear rate-of-change failure threshold is a failure threshold curve which parallels the expected voltage rate-of-change during discharge of the battery cell. The offset between the non-linear rate-of-change threshold and the actual voltage rate-of-change can be selected as desired for a particular application. For instance, in one implementation, the failure threshold value can be 20%-40% greater than the expected voltage rate-of-change for the rechargeable battery cell at different times during the operational state cycle.

Figure 8A:
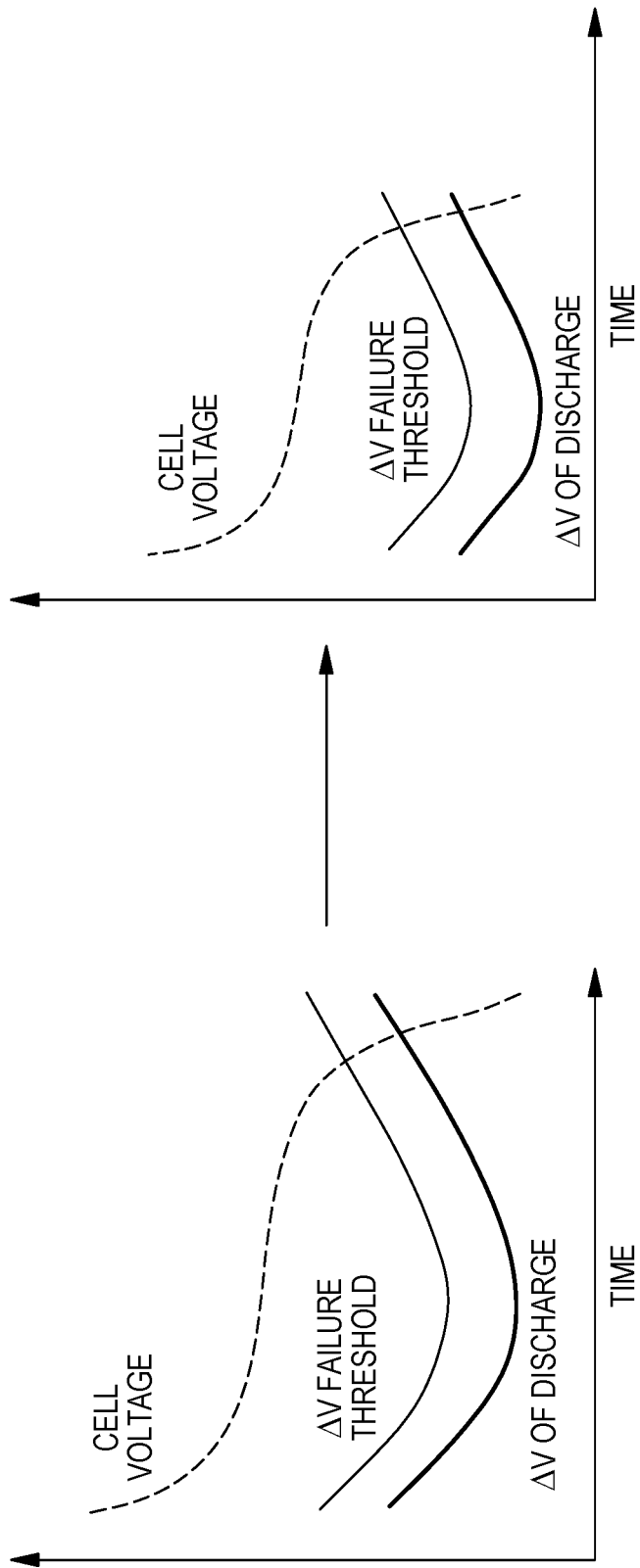
FIG. 8A graphically represents certain further aspects of rechargeable battery monitoring and control, in accordance with one or more aspects of the present invention.

As a further enhancement, the non-linear rate-of-change failure threshold can vary across the life of a battery pack, as well as the cells within the battery pack. As a battery cell ages, the cell's operational state curves compress along the time axis, resulting in a significantly different operational state curve at the beginning of cell life (see the left side of FIG. 8A), compared with that of the end of cell life (such as shown in the right side of FIG. 8A). Thus, the voltage rate-of-change failure threshold can be further dynamically adjusted based on the age of the battery cell or number of operational cycles (e.g., number of discharge cycles) the battery cell has experienced. At start of life, the cell is fresher (or healthier), so that it has a higher nominal voltage and a larger capacity, that is, a longer holdup time during discharge, than after a few years, or after a large number of discharge cycles. Therefore, the non-linear rate-of-change failure threshold curve used to determine whether a voltage rate-of-change is out-of-specification is (in one embodiment) deeper and longer at the start of life to account for the longer discharge curve of the cell. This is illustrated by way of example in FIG. 8A, where the non-linear rate-of-change failure threshold curve is tailored to mirror or parallel the expected or actual rate-of-change voltage during discharge of the rechargeable battery cell at different life cycle stages.

As shown, after time has passed, the rechargeable battery cell is no longer as fresh, and has a lower nominal voltage and lower capacity (shorter holdup time) than when new. In the curves for the older cell on the right side of FIG. 8A, the actual rate-of-change discharge voltage is shown to occur over a shorter discharge time interval, and to have shallower changes (in comparison to when newer (as shown on the left side of FIG. 8A)). In such a case, the failure threshold curve used to determine the voltage rate-of-change threshold is made shallower and shorter to account for the shorter discharge curve of the cell. Again, the result is that the non-linear rate-of-change failure threshold approximately parallels (or mirrors) the change in the actual voltage rate-of-change over time.

Figure 8B:
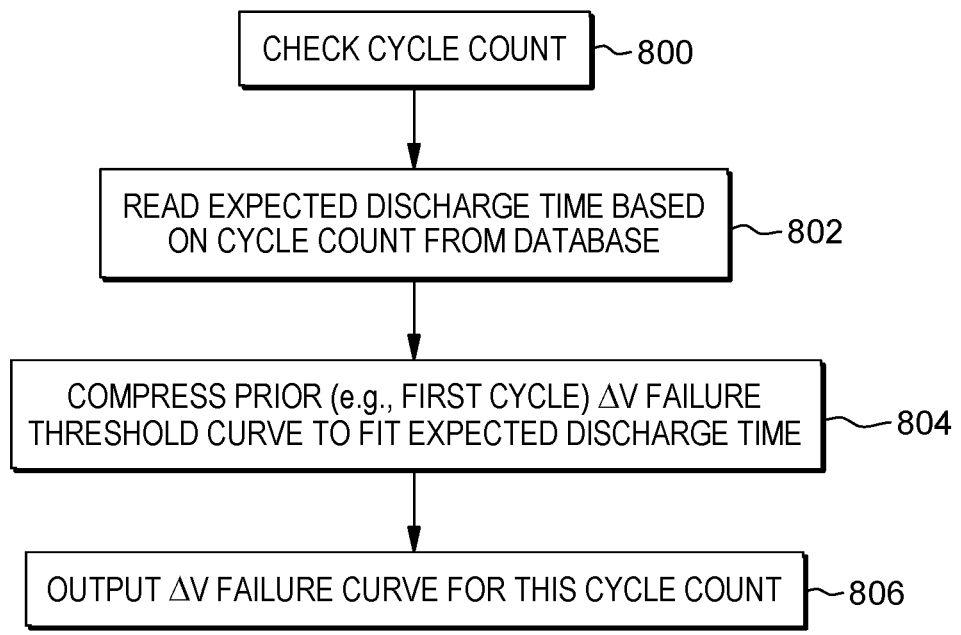
FIG. 8B depicts another embodiment of a workflow illustrating further aspects of some embodiments of the present invention.

FIG. 8B depicts one embodiment of control processing implementing one or more of the above-noted aspects of the present invention. In one embodiment, a cycle count is checked 800 when a non-linear rate-of-change failure threshold is to be obtained, and an expected discharge cycle time is ascertained based on the discharge cycle count from a database 802. In one embodiment, the database can be populated with failure threshold curves based on prior cell testing and/or previous operational states of the rechargeable battery cell, such as prior discharge states.

In one embodiment, the control compresses a prior failure threshold curve to fit the expected discharge time of the rechargeable battery cell, obtaining a compressed failure threshold curve 804. In one embodiment, the prior failure threshold curve can be an earlier threshold curve (such as an initial or first cycle failure threshold curve) used for the rechargeable battery cell. The non-linear rate-of-change failure threshold to be used is output for the current cycle count 806, which is then used in a compare process, such as described above in connection with FIG. 7.

Note that, in one or more embodiments, an additional extension of the control processes described can be implemented to account for, for instance, cell operating temperature variation when determining the non-linear rate-of-change failure threshold curve. This can include modifying the threshold curve to account for, for instance, lower available capacity, and a shorter discharge curve, at lower cell temperature, and the reverse at higher operational temperature of the rechargeable battery cell.

Further exemplary embodiments of a computing environment to implement one or more aspects of the present invention are described below with reference to FIGS. 9-11.

By way of further example, FIG. 9 depicts one embodiment of a computing environment 900, which includes a computing system 912. Examples of well-known computing systems, environments, and/or configurations that may be suitable for use with computer system 912 include, but are not limited to, a server, a desktop computer, a work station, a wireless computer, a handheld or laptop computer or device, a mobile phone, a programmable consumer electronic device, a tablet, a personal digital assistant (PDA), and the like.

Computing system 912 can be described in the general context of computer system-executable instructions, such as program modules, being executed by a computer system. Generally, program modules include routines, programs, objects, components, logic, data structures, and so on that perform particular tasks or implement particular abstract data types.

As depicted in FIG. 9, computing system 912, is shown in the form of a general-purpose computing device. The components of computing system 912 can include, but are not limited to, one or more processors or processing units 916, a system memory 923, and a bus 918 that couples various system components including system memory 923 to processor 916.

In one embodiment, processor 916 may be based on the z/Architecture® offered by International Business Machines Corporation, or other architectures offered by International Business Machines Corporation or other companies.

Bus 918 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computing system 912 can include a variety of computer system readable media. Such media may be any available media that is accessible by computing system 912, and it includes both volatile and non-volatile media, removable and non-removable media.

System memory 923 can include computer system readable media in the form of volatile memory, such as random access memory (RAM) 930 and/or cache memory 932. Computing system 912 can further include other removable/non-removable, volatile/non-volatile computer system storage media. By way of example only, storage system 934 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media could be provided. In such instances, each can be connected to bus 918 by one or more data media interfaces. As described below, memory 923 can include at least one program product having a set (e.g., at least one) of program modules or code that are configured to carry out the functions of embodiments of the invention.

Program/utility 940, having a set (at least one) of program modules 942, can be stored in memory 932 by way of example, and not limitation, as well as an operating system, one or more application programs, other program modules, and program data. Each of the operating system, one or more application programs, other program modules, and program data or some combination thereof, can include an implementation of a networking environment. Program modules 942 generally carry out the functions and/or methodologies of embodiments of the invention as described herein. Alternatively, a rechargeable battery monitoring and control facility, module, logic, etc., 901 can be provided within computing environment 912, as disclosed herein.

Computing system 912 can also communicate with one or more external devices 914 such as a keyboard, a pointing device, a display 924, etc.; one or more devices that enable a user to interact with computing system 912; and/or any devices (e.g., network card, modem, etc.) that enable computing system 912 to communicate with one or more other computing devices. Such communication can occur via Input/Output (I/O) interfaces 922. Still yet, computing system 912 can communicate with one or more networks such as a local area network (LAN), a general wide area network (WAN), and/or a public network (e.g., the Internet) via network adapter 920. As depicted, network adapter 920 communicates with the other components of computing system, 912, via bus 918. It should be understood that although not shown, other hardware and/or software components could be used in conjunction with computing system 912. Examples, include, but are not limited to: microcode, device drivers, redundant processing units, external disk drive arrays, RAID systems, tape drives, and data archival storage systems, etc.

One or more aspects may relate to or use cloud computing.

It is understood in advance that although this disclosure includes a detailed description on cloud computing, implementation of certain teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

A cloud computing node can include a computer system/server, such as the one depicted in FIG. 9. Computer system/server 912 of FIG. 9 can be practiced in distributed cloud computing environments where tasks are performed by remote processing devices that are linked through a communications network. In a distributed cloud computing environment, program modules may be located in both local and remote computer system storage media including memory storage devices. Computer system/server 912 is capable of being implemented and/or performing any of the functionality set forth hereinabove.

Figure 10:
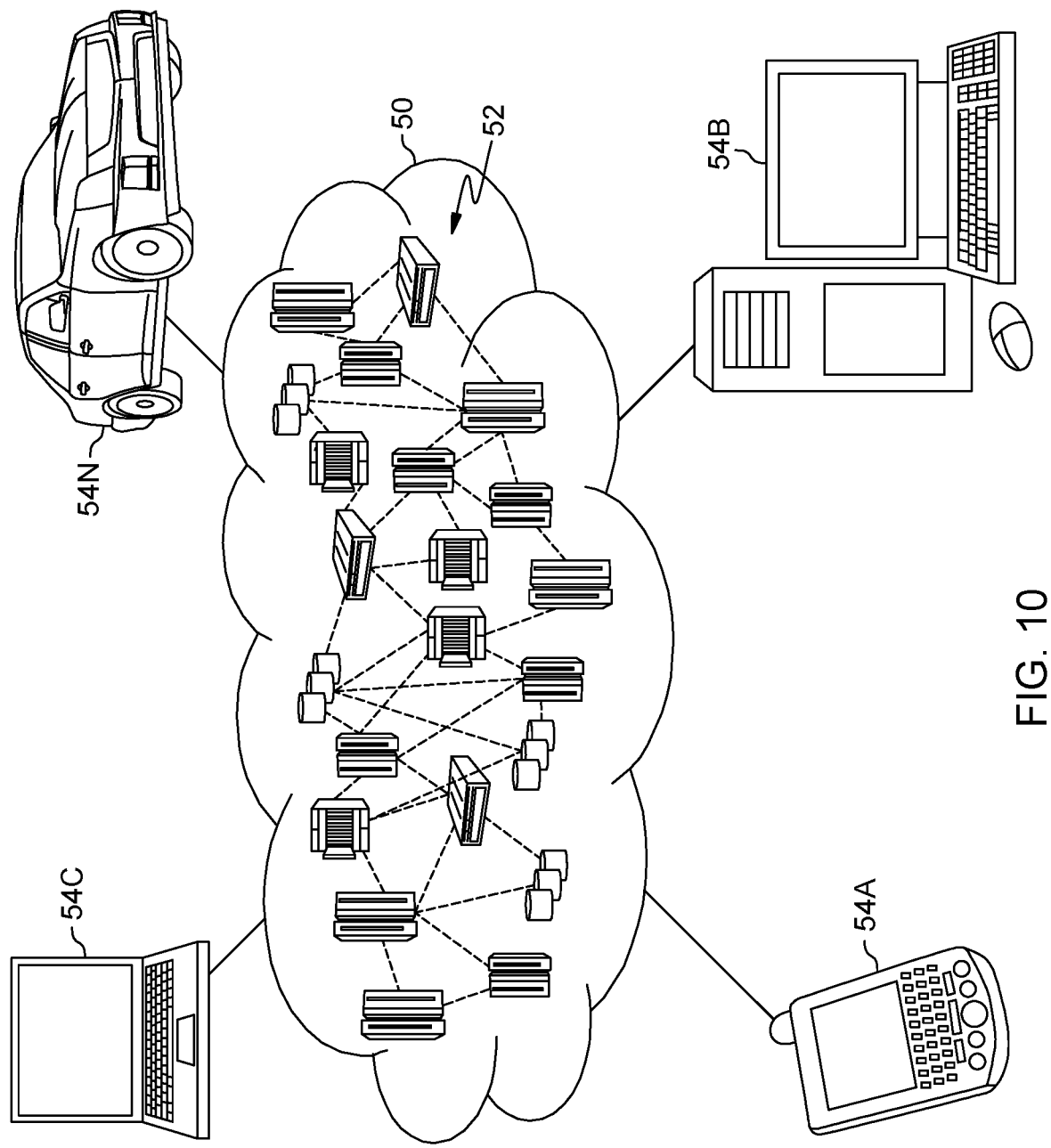
FIG. 10 depicts one embodiment of a cloud computing environment which can facilitate implementing, or be used in association with, certain aspects of an embodiment of the present invention.

Referring now to FIG. 10, illustrative cloud computing environment 50 is depicted. As shown, cloud computing environment 50 can comprise one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 6 are intended to be illustrative only and that computing nodes 10 and cloud computing environment 50 can communicate with any type of computerized device over any type of network and/or network addressable connection (e.g., using a web browser).

Figure 11:
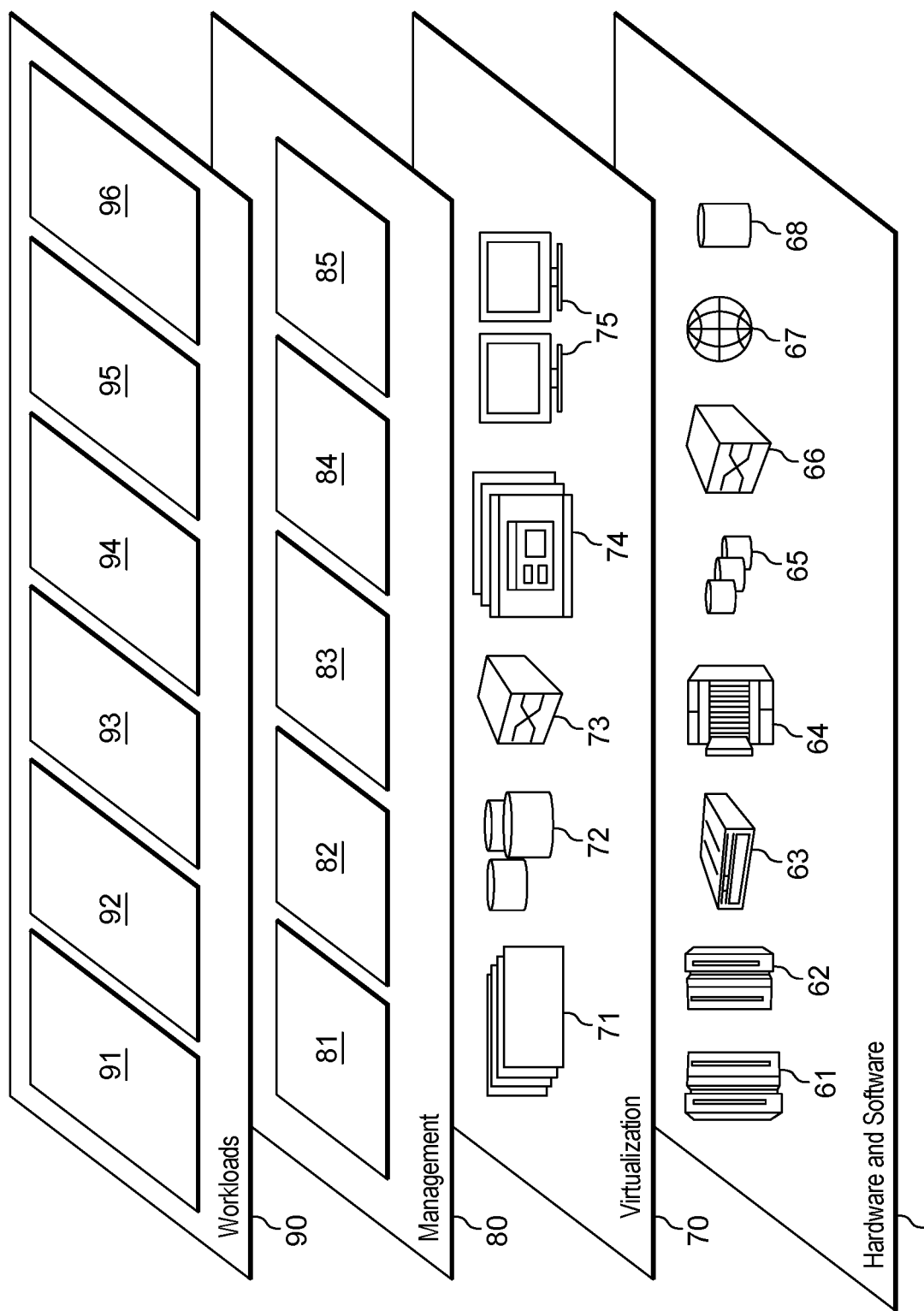
FIG. 11 depicts abstraction model layers according to an embodiment of the present invention.

Referring to FIG. 11, a set of functional abstraction layers provided by cloud computing environment 50 (FIG. 10) is shown. It should be understood in advance that the components, layers, and functions shown in FIG. 10 are intended to be illustrative only and embodiments of the invention are not limited thereto. As depicted, the following layers and corresponding functions are provided:

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and rechargeable battery control processing 96.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different instructions, instruction formats, instruction fields and/or instruction values may be used. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    initially obtaining a non-linear rate-of-change failure threshold indicative of an operational state abnormality in a rechargeable battery cell;
    during the operational state of the rechargeable battery cell, comparing, by a control, an actual voltage rate-of-change of the rechargeable battery cell to the initially obtained non-linear rate-of-change failure threshold;
    based on the actual voltage rate-of-change of the rechargeable battery cell exceeding the initially obtained non-linear rate-of-change failure threshold, identifying, by the control, the operational state abnormality in the rechargeable battery cell; and
    based on identifying the operational state abnormality in the rechargeable battery cell, discontinuing by the control the operational state of the rechargeable battery cell.

2. The method of claim 1, wherein the non-linear rate-of-change failure threshold comprises a failure threshold curve which is substantially parallel to an expected voltage rate-of-change curve for the rechargeable battery cell during the operational state.

3. The method of claim 1, wherein the operational state is a discharge state of the rechargeable battery cell, and the non-linear rate-of-change failure threshold comprises a voltage rate-of-change threshold which varies in time in a concave manner during a discharge cycle of the rechargeable battery cell.

4. The method of claim 1, wherein the non-linear rate-of-change failure threshold is predetermined, and is obtained, by the control, from a database of predetermined non-linear failure threshold curves using an operational state cycle time of the rechargeable battery cell, the operational state cycle time used to obtain the non-linear rate-of-change failure threshold being a previous operational state cycle time of the rechargeable battery cell, and wherein the particular non-linear rate-of-change failure threshold obtained from the database varies for different operational state cycle times of the rechargeable battery cell.

5. The method of claim 1, wherein the obtaining comprises obtaining, via machine learning, the non-linear rate-of-change failure threshold based on one or more voltage rate-of-changes experienced during one or more prior operational state cycles of the rechargeable battery cell.

6. The method of claim 1, wherein the obtained non-linear rate-of-change failure threshold varies across operational state cycles of the rechargeable battery cell, and the obtained non-linear rate-of-change failure threshold is based, at least in part, on an operational state cycle count for the rechargeable battery cell.

7. The method of claim 6, wherein the operational state is a discharge state of the rechargeable battery cell, and the obtaining comprises obtaining an expected discharge cycle time for discharge of the rechargeable battery cell based on a discharge cycle count for the rechargeable battery cell, and compressing a prior failure threshold curve to fit the expected discharge cycle time and obtain a compressed failure threshold curve, the obtained non-linear rate-of-change failure threshold being the compressed failure threshold curve.

8. The method of claim 7, wherein the operational state is a discharge state of the rechargeable battery cell, and the obtained non-linear rate-of-change failure threshold comprises a voltage rate-of-change threshold which varies in time in a concave manner during a discharge cycle of the rechargeable battery cell, and the compressing makes the prior failure threshold curve shallower for voltage rate-of-change and shorter in discharge cycle time to obtain the compressed failure threshold curve.

9. The method of claim 1, further comprising providing, by the control, an indication of the operational state abnormality based on identifying the operational state abnormality in the rechargeable battery cell.

10. A system comprising:
a control, the control being operatively coupled to a rechargeable battery cell to control operation thereof, the control:
initially obtaining a non-linear rate-of-change failure threshold indicative of an operational state abnormality in the rechargeable battery cell;
during the operational state of the rechargeable battery cell, comparing an actual voltage rate-of-change of the rechargeable battery cell to the initially obtained non-linear rate-of-change failure threshold;
based on the actual voltage rate-of-change of the rechargeable battery cell exceeding the initially obtained non-linear rate-of-change failure threshold, identifying the operational state abnormality in the rechargeable battery cell; and
based on identifying the operational state abnormality in the rechargeable battery cell, discontinuing by the control the operational state of the rechargeable battery cell.

11. The system of claim 10, wherein the non-linear rate-of-change failure threshold comprises a failure threshold curve which is substantially parallel to an expected voltage rate-of-change curve for the rechargeable battery cell during the operational state.

12. The system of claim 10, wherein the operational state is a discharge state of the rechargeable battery cell, and the non-linear rate-of-change failure threshold comprises a voltage rate-of-change threshold which varies in time in a concave manner during a discharge cycle of the rechargeable battery cell.

13. The system of claim 10, wherein the non-linear rate-of-change failure threshold is predetermined, and is obtained, by the control, from a database of predetermined non-linear failure threshold curves using an operational state cycle time of the rechargeable battery cell, the operational state cycle time used to obtain the non-linear rate-of-change failure threshold being a previous operational state cycle time of the rechargeable battery cell, and wherein the particular non-linear rate-of-change failure threshold obtained from the database varies for different operational state cycle times of the rechargeable battery cell.

14. The system of claim 10, wherein the obtaining comprises obtaining, via machine learning, the non-linear rate-of-change failure threshold based on one or more voltage rate-of-changes experienced during one or more prior operational state cycles of the rechargeable battery cell.

15. The system of claim 10, wherein the obtained non-linear rate-of-change failure threshold varies across operational state cycles of the rechargeable battery cell, and the obtained non-linear rate-of-change failure threshold is based, at least in part, on an operational state cycle count for the rechargeable battery cell.

16. The system of claim 15, wherein the operational state is a discharge state of the rechargeable battery cell, and the obtaining comprises obtaining an expected discharge cycle time for discharge of the rechargeable battery cell based on a discharge cycle count for the rechargeable battery cell, and compressing a prior failure threshold curve to fit the expected discharge cycle time and obtain a compressed failure threshold curve, the obtained non-linear rate-of-change failure threshold being the compressed failure threshold curve.

17. The system of claim 16, wherein the operational state is a discharge state of the rechargeable battery cell, and the obtained non-linear rate-of-change failure threshold comprises a voltage rate-of-change threshold which varies in time in a concave manner during a discharge cycle of the rechargeable battery cell, and the compressing makes the prior failure threshold curve shallower for voltage rate-of-change and shorter in discharge cycle time to obtain the compressed failure threshold curve.

18. A computer program product comprising:
at least one computer-readable storage medium having computer-readable code embodied therein, the computer-readable code being executable by one or more processors to cause the one or more processors to:
initially obtain a non-linear rate-of-change failure threshold indicative of an operational state abnormality in a rechargeable battery cell;
during the operational state of the rechargeable battery cell, comparing, by a control, an actual voltage rate-of-change of the rechargeable battery cell to the initially obtained non-linear rate-of-change failure threshold;
based on the actual voltage rate-of-change of the rechargeable battery cell exceeding the initially obtained non-linear rate-of-change failure threshold, identifying, by the control, the operational state abnormality in the rechargeable battery cell; and
based on identifying the operational state abnormality in the rechargeable battery cell, discontinuing by the control the operational state of the rechargeable battery cell.

19. The computer program product of claim 18, wherein the non-linear rate-of-change failure threshold comprises a failure threshold curve which is substantially parallel to an expected voltage rate-of-change curve for the rechargeable battery cell during the operational state.

20. The computer program product of claim 18, wherein the operational state is a discharge state of the rechargeable battery cell, and the non-linear rate-of-change failure threshold comprises a voltage rate-of-change threshold which varies in time in a concave manner during a discharge cycle of the rechargeable battery cell.

\* \* \* \* \*